(12) United States Patent
Lee et al.

(10) Patent No.: US 11,688,644 B2
(45) Date of Patent: Jun. 27, 2023

(54) FIN ISOLATION STRUCTURE FOR FINFET AND METHOD OF FORMING THE SAME

(71) Applicant: Taiwan Semiconductor Manufacturing Company, Ltd., Hsinchu (TW)

(72) Inventors: Chu-An Lee, Hsinchu (TW); Chen-Hao Wu, Hsinchu (TW); Peng-Chung Jangjian, Hsinchu (TW); Chun-Wen Hsiao, Hsinchu (TW); Teng-Chun Tsai, Hsinchu (TW); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 27 days.

(21) Appl. No.: 17/245,768

(22) Filed: Apr. 30, 2021

(65) Prior Publication Data
US 2021/0265222 A1    Aug. 26, 2021

Related U.S. Application Data

(63) Continuation of application No. 16/927,145, filed on Jul. 13, 2020, now Pat. No. 10,998,239, which is a continuation of application No. 16/277,326, filed on Feb. 15, 2019, now Pat. No. 10,714,395.

(60) Provisional application No. 62/732,657, filed on Sep. 18, 2018.

(51) Int. Cl.
| H01L 21/8234 | (2006.01) |
| H01L 21/76 | (2006.01) |
| H01L 29/06 | (2006.01) |
| H01L 27/088 | (2006.01) |
| H01L 21/762 | (2006.01) |
| H01L 21/3105 | (2006.01) |

(52) U.S. Cl.
CPC .......... *H01L 21/823481* (2013.01); *H01L 21/76224* (2013.01); *H01L 21/823431* (2013.01); *H01L 27/0886* (2013.01); *H01L 29/0649* (2013.01); *H01L 21/31053* (2013.01)

(58) Field of Classification Search
CPC ....... H01L 21/823481; H01L 21/76224; H01L 21/823431; H01L 21/31053; H01L 27/0886
USPC ........................................................ 257/401
See application file for complete search history.

(56) References Cited

U.S. PATENT DOCUMENTS

| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |

(Continued)

*Primary Examiner* — Monica D Harrison
(74) *Attorney, Agent, or Firm* — Birch, Stewart, Kolasch & Birch, LLP

(57) ABSTRACT

A semiconductor device structure is provided. The semiconductor device structure includes a substrate having adjacent first and second fins protruding from the substrate. A first gate structure and a second gate structure are across the first and second fins, respectively. An insulating structure is formed between the first gate structure and the second gate structure and includes a first insulating layer separating the first fin from the second fin, a capping structure formed in the first insulating layer, and a second insulating layer covered by the first insulating layer and the capping structure.

20 Claims, 13 Drawing Sheets

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,735,156 B1 | 8/2017 | Cha |
| 10,714,395 B2 | 7/2020 | Lee et al. |
| 2015/0325575 A1* | 11/2015 | Park ............ H01L 29/165 257/401 |
| 2016/0126141 A1 | 5/2016 | Kim et al. |

\* cited by examiner

FIN ISOLATION STRUCTURE FOR FINFET AND METHOD OF FORMING THE SAME

PRIORITY CLAIM AND CROSS-REFERENCE

This application is a Continuation of pending U.S. patent application Ser. No. 16/927,145, filed Jul. 13, 2020, which is a Continuation of U.S. patent application Ser. No. 16/277,326, filed Feb. 15, 2019 (now U.S. Pat. No. 10,714,395 issued on Jul. 14, 2020), which claims the benefit of U.S. Provisional Application No. 62/732,657, filed on Sep. 18, 2018, and entitled "FIN ISOLATION STRUCTURE FOR FINFET AND METHOD OF FORMING THE SAME," the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over three sides (e.g., wrapping) the fin. Advantages of the FinFET may include reducing the short channel effect and increasing the current flow.

Although existing FinFET manufacturing processes have been generally adequate for their intended purposes, as the size of FinFET scaling-down continues, they have not been entirely satisfactory in formation of isolation structure for adjacent fins in the FinFET device structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
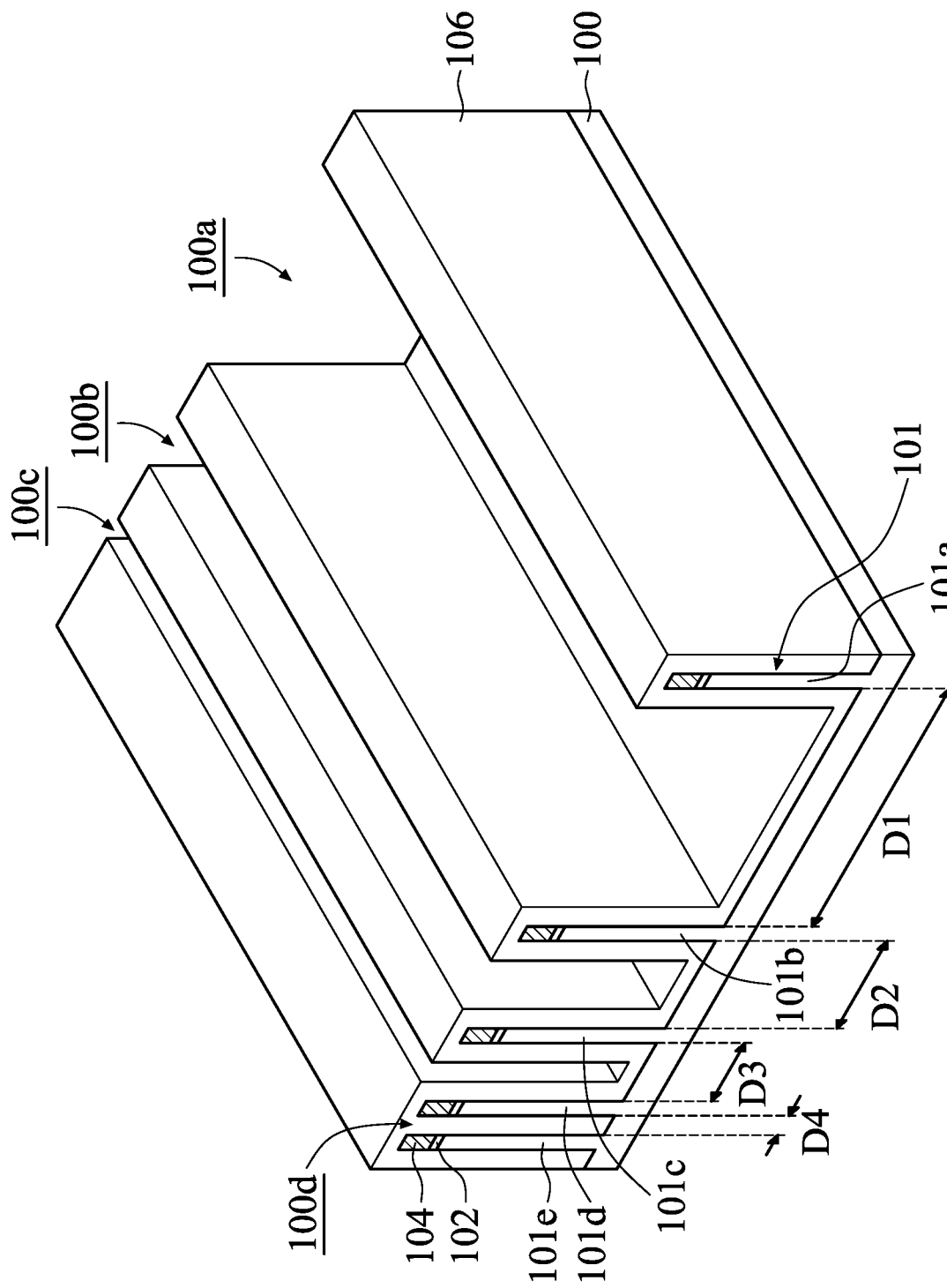
FIGS. 1, 2, 3, 4, 5, 6, 7, 8, and 9 show perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of methods of forming a semiconductor device structure are provided. The formation of the semiconductor device structure includes forming an insulating liner over a substrate having at least adjacent two fins. Afterwards, a first insulating layer is formed over the insulating liner to cover the adjacent fins and the substrate between the adjacent fins. Afterwards, a second insulating layer is formed over the first insulating layer between the adjacent fins, and a first capping layer and a second capping layer are successively formed over the first insulating layer and the second insulating layer. Afterwards, a chemical mechanical polishing (CMP) process is performed to expose the adjacent fins and form a dual capping structure that includes the remaining first and second capping layers over the second insulating layer. This remaining second capping layer is made of a nitrogen-free material and serves as a CMP stop layer for exposure of the first and second fins. As a result, the nitrogen-free material prevents the property of the CMP slurry from being changed, so as to ensure that the CMP process can stop on the top surfaces of the first and second fins.

FIGS. 1, 2, 3, 4, 5, 6, 7, 8, and 9 show perspective representations of various stages of forming a semiconductor device structure, in accordance with some embodiments of the disclosure. In some embodiments, the semiconductor device structure is implemented as a fin field effect transistor (FinFET) structure. As shown in FIG. 1, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

Afterwards, the substrate 100 is patterned to form a fin structure 101 including fins and trench openings between adjacent fins, in accordance with some embodiments. In some embodiment, before the substrate 100 is patterned, a first masking layer 102 and a second masking layer 104 may be successively formed over the substrate 100. In some embodiments, the first masking layer 102 serves a buffer layer or an adhesion layer that is formed between the underlying substrate 100 and the overlying second masking layer 104. The first masking layer 102 may also be used as an etch stop layer when the second masking layer 104 is removed or etched. In some embodiments, the first masking layer 102 is made of silicon oxide. In some embodiments, the first masking layer 102 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 104 is made of silicon oxide, silicon nitride, silicon oxynitride, or another applicable material. In some embodiments, the second masking layer 104 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the first masking layer 102 and the second masking layer 104, the first masking layer 102 and the overlying second masking layer 104 are patterned by a photolithography process and an etching process, so as to expose portions of the substrate 100. For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, an neutral beam etching (NBE) process, the like, or a combination thereof.

Afterwards, an etching process is performed on the substrate 100 to form the fin structure 101 including fins protruding from the substrate 100 and trench openings in the substrate 100 by using the patterned first masking layer 102 and the patterned second masking layer 104 as an etch mask. In order to simplified the diagram, five fins 101a, 101b, 101c, 101d, and 101e and four and trench openings 100a, 100b, 100c, and 100d are depicted as an example. In some embodiments, those fins 101a, 101b, 101c, 101d, and 101e have different spaces therebetween. More specifically, the adjacent fins 101a and 101b that are spaced apart from each other by a distance D1 to define the trench opening 100a. The adjacent fins 101b and 101c are spaced apart from each other by a distance D2 to define the trench opening 100b. The adjacent fins 101c and 101d are spaced apart from each other by a distance D3 to define the trench opening 100c. The adjacent fins 101d and 101e are spaced apart from each other by a distance D4 to define the trench opening 100d. The distance D1 is greater than the distance D2, the distance D2 is greater than the distance D3, and the distance D3 is greater than the distance D4.

In some embodiments, the etching process for formation of the fin structure 101 is a dry etching process or a wet etching process. In an example, the substrate 100 is etched by a dry etching process, such as an RIE process, an NBE process, the like, or a combination thereof. The dry etching process may be performed using a process gas including fluorine-based etchant gas. For example, the process gas may include $SF_6$, $C_xF_y$, $NF_3$ or a combination thereof. In some other embodiments, each of the fin structure 101 may have tapered sidewalls. For example, each of the fin structure 101 has a width that gradually increases from the top portion to the lower portion. A person of ordinary skill in the art will readily understand other methods of forming the fin structures, which are contemplated within the scope of some embodiments.

After the fin structure 101 is formed, an insulating liner 106 is formed over the patterned substrate 100, as shown in FIG. 1 in accordance with some embodiments. In some embodiments, the insulating liner 106 covers the surfaces of the patterned second masking layer 104, the patterned first masking layer 102, and the patterned substrate 100 having fins 101a, 101b, 101c, 101d, and 101e. Since the distance D4 between the adjacent fins 101d and 101e is small, the insulating liner 106 may entirely fill the space between the adjacent fins 101d and 101e. Moreover, the insulating liner 106 conformally lines the sidewalls and bottoms of the other trench openings 100a, 100b, and 100c.

In some embodiments, the insulating liner 106 is made of silicon oxide, fluorosilicate glass (FSG), a low-k dielectric material, and/or another suitable dielectric material or another low-k dielectric material. The insulating liner 106 may be deposited by an atomic layer deposition (ALD) process, a chemical vapor deposition (CVD) process, a flowable CVD (FCVD) process, or another applicable process.

Figure 2:
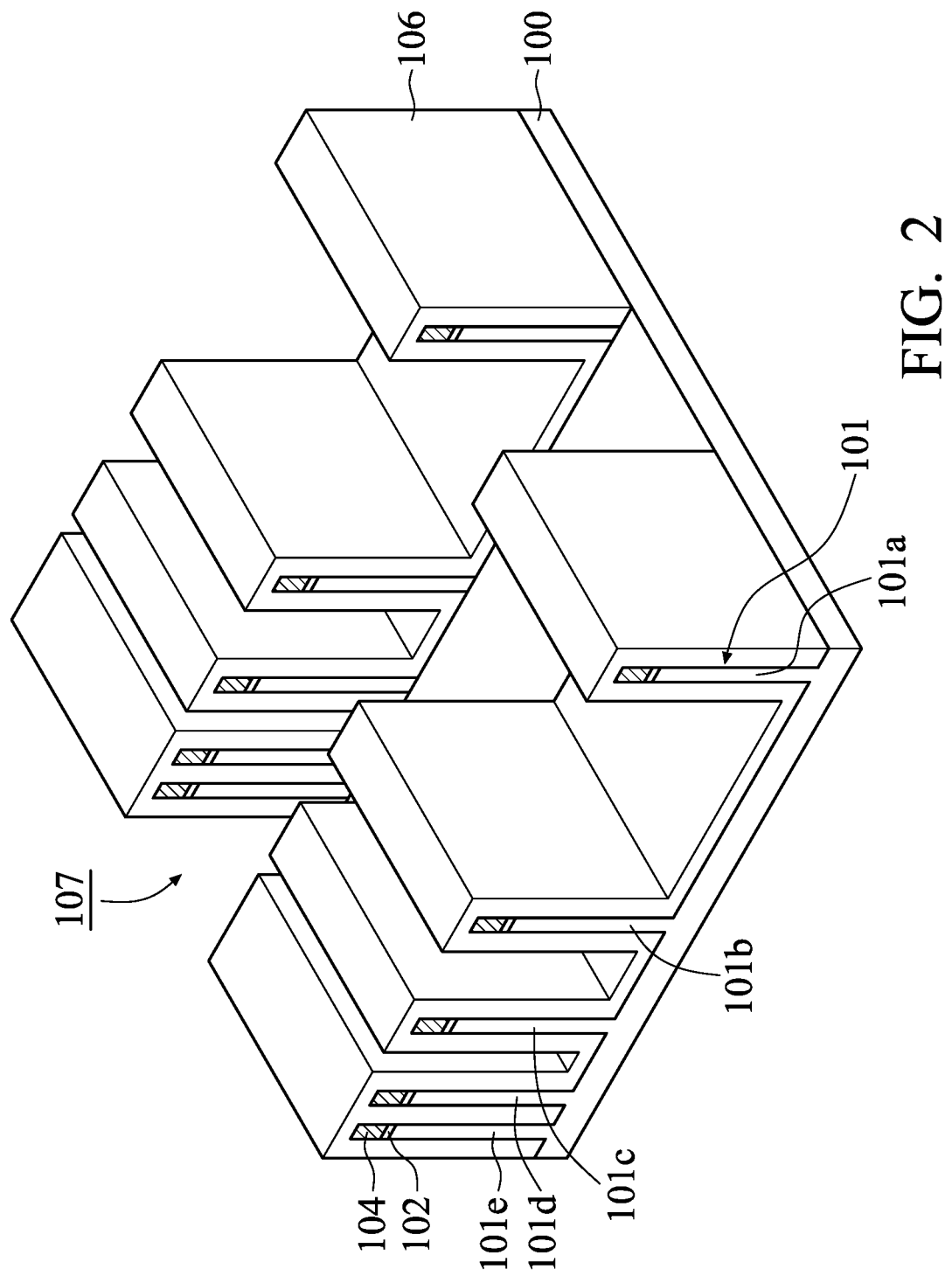

After the insulating liner 106 is formed, a fin cut process is performed to divide each of the fins 101a, 101b, 101c, 101d, and 101e into at least two parts, as shown in FIG. 2 in accordance with some embodiments. In some embodiments, after the fin cut process is performed, the fins 101a, 101b, 101c, 101d, and 101e that are covered by the patterned first masking layer 102, the patterned second masking layer 194, and the insulating liner 106 are respectively separated into two parts so as to form a cutting opening 107 between the two parts of each fin. The fin cut process may include a photolithography process and an etching process (such as a wet etching process, a dry etching process, or a combination thereof).

Figure 3:
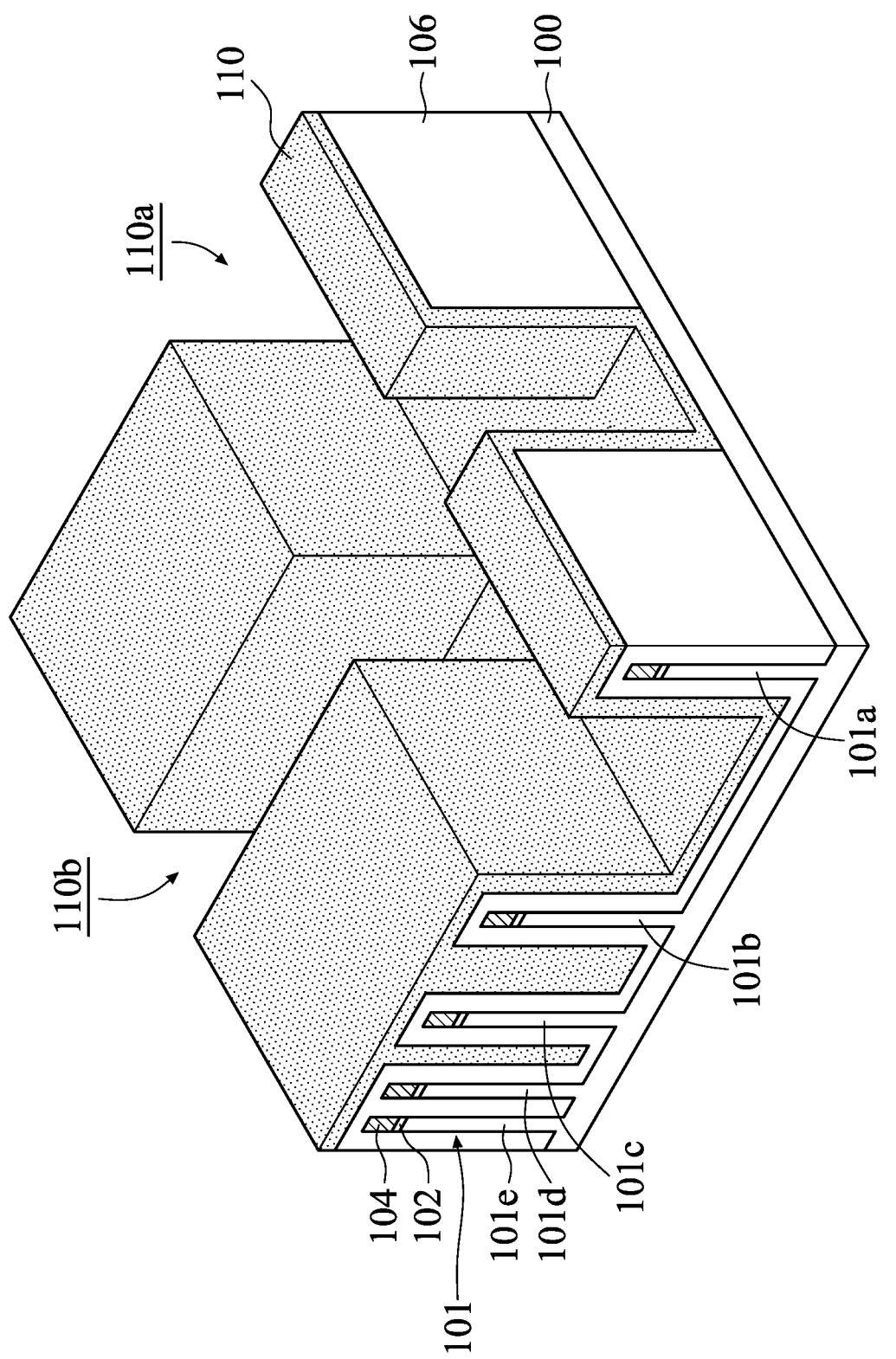

After the fin cut process is performed, an insulating layer 110 is formed over the insulating liner 106, as shown in FIG. 3 in accordance with some embodiments. In some embodiments, the formed insulating layer 110 also covers the surfaces of the patterned second masking layer 104, the patterned first masking layer 102, and the patterned substrate 100 having fins 101a, 101b, 101c, 101d, and 101e. Since the trench openings 100b and 100c (not shown and indicated in FIG. 1) become smaller after the formation of the insulating liner 106, the insulating layer may entirely fill the trench openings 106b and 106c. Moreover, the insulating layer 110 conformally lines the sidewalls and bottoms of the trench opening 100a (not shown and indicated in FIG. 1) and the cutting opening 107 (not shown and indicated in FIG. 2) and respectively form an opening 110a between the adjacent fins 101a and 101b and an opening 110b between two parts of each fin. As a result, the insulating layer 110 in the trench opening 100a is covered by the insulating liner 106.

In some embodiments, the insulating layer 110 is made of a nitrogen-containing material or carbon- and nitrogen-containing material. For example, the insulating layer 110 is made of SiN, SiON, SiCN, SiOCN, TiN, AlON or another applicable material. The insulating layer 110 may be deposited by an ALD process, a CVD process, or another applicable process.

Figure 4:
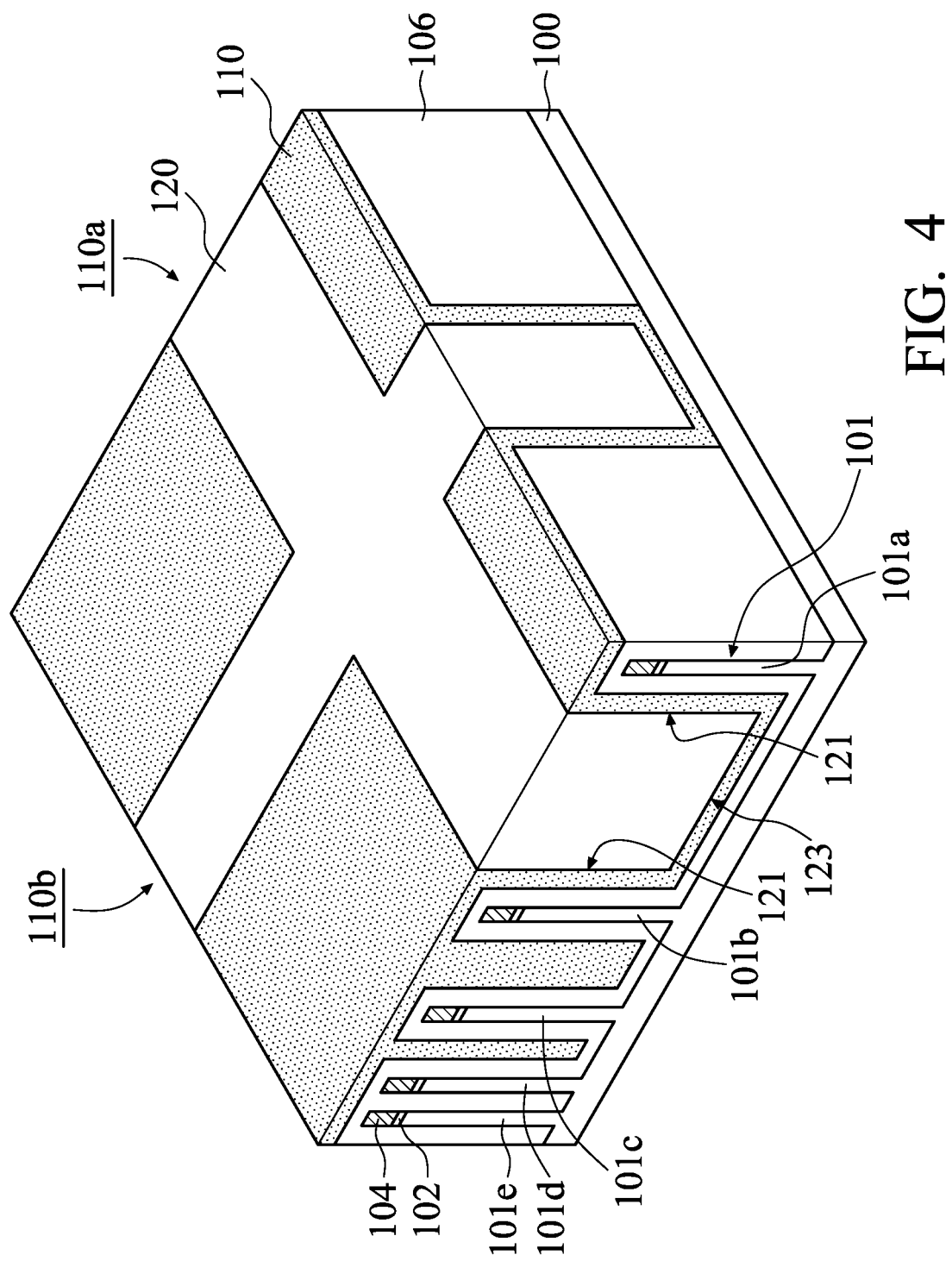
Figure 5:
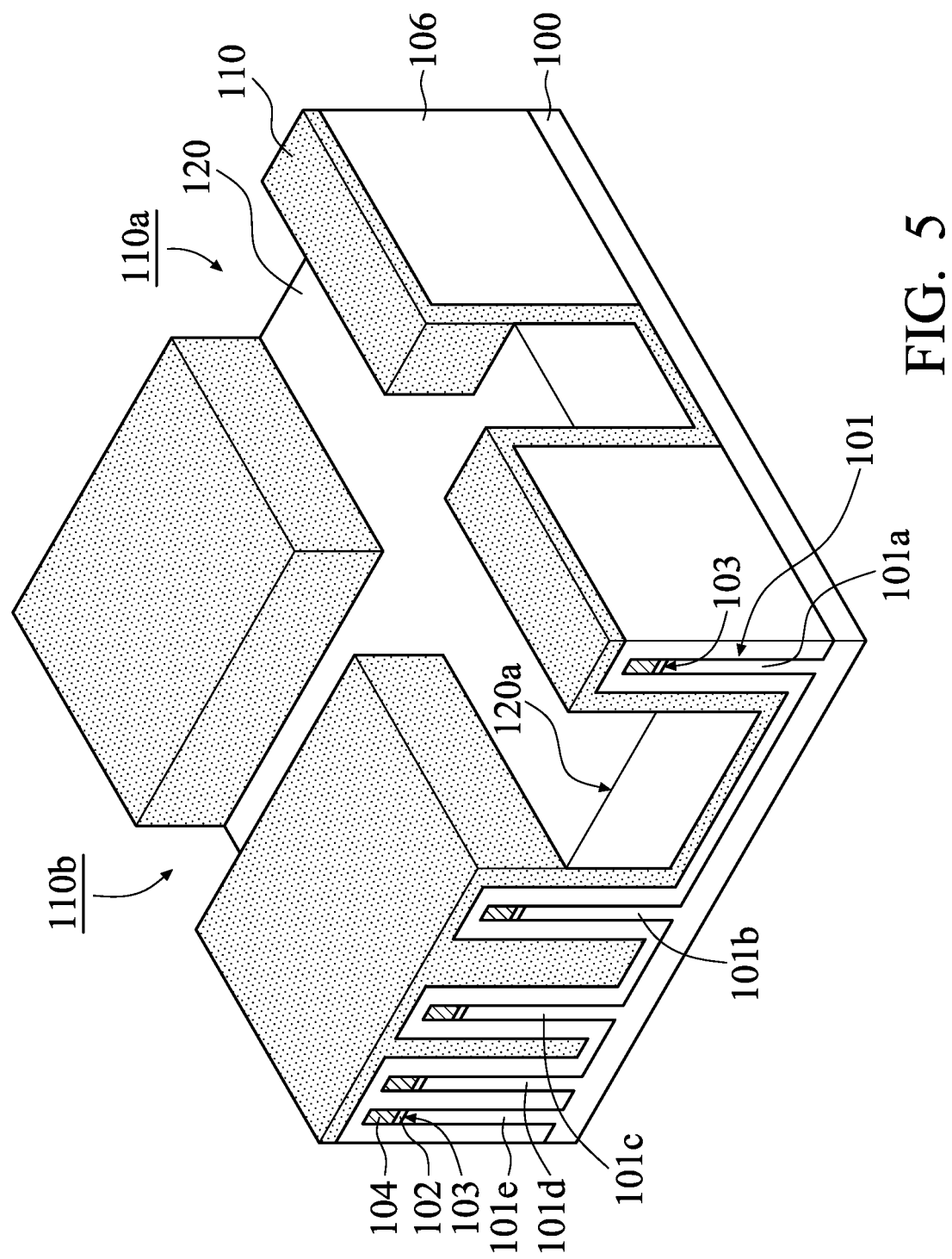

After the insulating layer 110 is formed, the lower portions of the openings 110a and 110b are filled with an insulating layer 120, as shown in FIGS. 4 and 5 in accordance with some embodiments. In some embodiments, the insulating layer 120 is formed over the insulating layer 110 above the patterned second masking layer 104 and fills the openings 110a and 110b. As a result, the insulating layer 120 in the opening 110a has sidewall surfaces 121 and a bottom surface 123 that are covered by the insulating layer 110, as shown in FIG. 4.

In some embodiments, the insulating layer 120 is made of a material that is the same as or similar to that of the insulating liner 106. For example, the insulating layer 12 is made of silicon oxide, FSG, a low-k dielectric material, and/or another suitable dielectric material or another low-k dielectric material. The insulating layer 12 may be formed by a deposition process, such as CVD, ALD, FCVD, high density plasma CVD (HDPCVD), metal organic CVD (MOCVD), plasma enhanced CVD (PECVD), or another applicable process.

Afterwards, a planarization layer (not shown) is form over the insulating layer 120 for subsequent planarization process, in accordance with some embodiments. In some embodiments, the planarization layer is made of a dielectric material, such as oxide, and is formed by a deposition process, such as CVD, PECVD, or another applicable process.

After the planarization layer is formed, a planarization process is performed on the planarization layer until the insulating layer 110 is exposed, as shown in FIG. 4 in accordance with some embodiments. In some embodiments, a CMP process is performed to remove the insulating layer 120 and the overlying planarization layer above the openings 1101 and 110b to expose the insulating layer 110, so that the remaining insulating layer 120 has a top surface that is substantially level with that of the insulating layer 110.

In some embodiments, after the CMP process is performed, the remaining insulating layer 120 is further recessed by an etching process, such as a dry etching process, a wet etching process, or a combination thereof, as shown in FIG. 5. The insulating layer 120 is etched back to a depth to expose upper portions of the openings 110a and 110b, so that the top surface 120a of the recessed insulating layer 120 is lower than the top surfaces 103 of the fins 101a, 101b, 101c, 101d, and 101e. In some embodiments, the height difference between the top surface 120a and the top surfaces 103 is in a range from about 1 Å to about 1000 Å.

Figure 6:
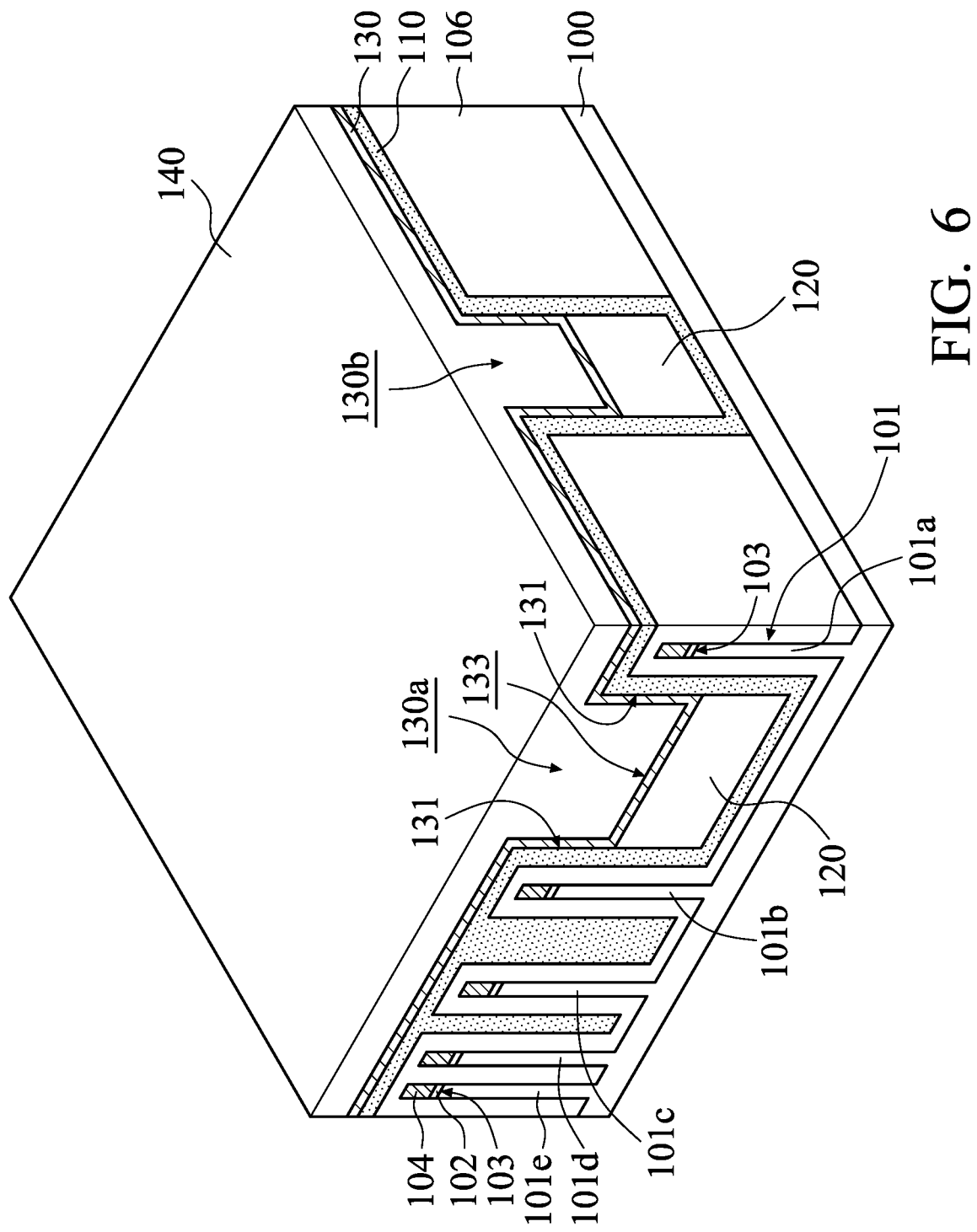

After the insulating layer 120 is recessed to expose the upper portion of the openings 110a and 110b, a first capping layer 130 and a second capping layer 140 are successively formed over the structure shown in FIG. 5, as shown in FIG. 6 in accordance with some embodiments. In some embodiments, the first capping layer 130 is formed over the insulating layer 110 above the fins 101a, 101b, 101c, 101d, and 101e and the insulating layer 120 in the openings 110a and 110b (not shown and indicated in FIG. 5) and conformally lines the upper portion of the openings 110a and 110b, so as to form openings 130a and 130b corresponding to the openings 110a and 110b and between the fins 101a and 101b and between the two parts of each fin.

In some embodiments, the first capping layer 130 in the opening 110a has sidewall surfaces 131 covered by the insulating layer 110. Moreover, the second insulating layer 120 provides a sufficient recess depth, so that the bottom 133 of the opening 130a is below the top surfaces 103 of the fins 101a, 101b, 101c, 101d, and 101e. As a result, the top surfaces 103 of the fins 101a, 101b, 101c, 101d, and 101e is higher than the bottom 133 of the opening 130a and lower than the top surface of the subsequent formed second capping layer 140. In some embodiments, the first capping layer 130 serves as an etching stop layer for the subsequent etching process in the fabrication of the semiconductor device structure.

In some embodiments, the second capping layer 140 is formed over the insulating layer 110 above the patterned second masking layer 104 and fills the openings 130a and 130b. As a result, the second capping layer 140 in the opening 130a has sidewall surfaces 131 and a bottom surface (i.e., the bottom 133 of the opening 130a) that are covered by the first capping layer 130, so that the insulating layer 110 between the fins 101a and 101b is separated from the second capping layer 140 by the first capping layer 130.

In some embodiments, the first capping layer 130 is made of a nitrogen-containing material or carbon- and nitrogen-containing material. For example, the first capping layer 130 is made of SiN, SiON, SiCN, SiOCN, TiN, AlON or another applicable material. The first capping layer 130 may be deposited by an ALD process, a CVD process, or another applicable process. In some embodiments, the second capping layer 140 is made of a material that is different from the material of the first capping layer 130. For example, the second capping layer 140 is made of a nitrogen-free material. For example, the first second capping layer 140 is made of Si, SiC, SiOC, SiO, SiO$_2$, HfO$_x$, ZrO$_2$, Al$_2$O$_3$, or another applicable material. The second capping layer 140 may be deposited by a CVD process, a PECVD process, or another applicable process.

Figure 7:
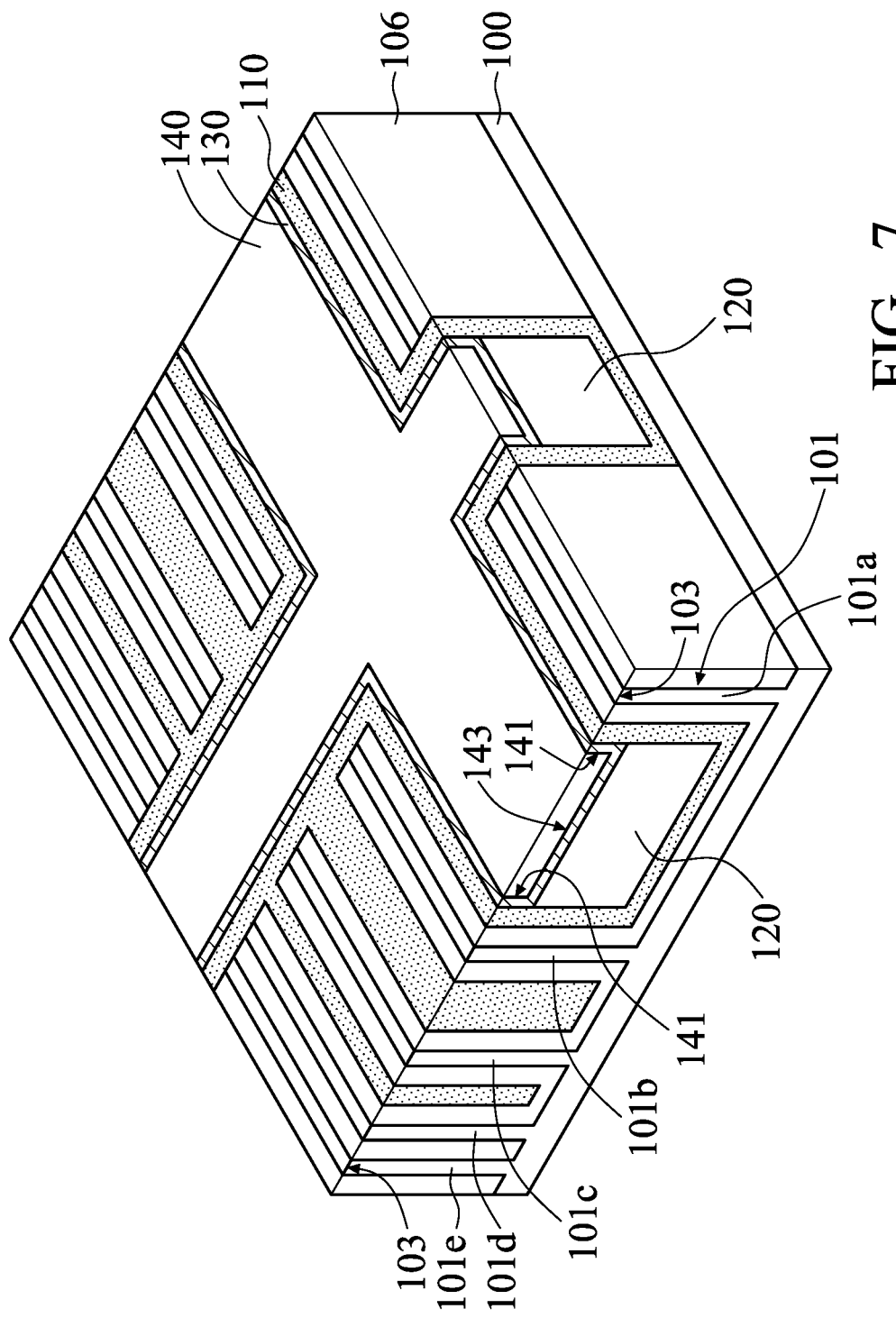

After the second capping layer 140 is formed, a polishing process is performed on the structure shown in FIG. 6, as shown in FIG. 7 in accordance with some embodiments. In some embodiments, the layers above the fins 101a, 101b, 101c, 101d, and 101e are removed by the polishing process, such as a CMP process, so as to expose the fins 101a, 101b, 101c, 101d, and 101e and form a dual capping structure to cover the entire top surface 120a (not shown and indicated in FIG. 5) of the insulating layer 120. More specifically, the second capping layer 140, the first capping layer 130, the insulating layer 110, the insulating liner 106, the patterned second masking layer 104, and the patterned first masking layer 102 above the fins 101a, 101b, 101c, 101d, and 101e are successively removed by the polishing process, so that fins 101a, 101b, 101c, 101d, and 101e are exposed. In some embodiments, the polishing process (e.g., the CMP process) is performed using a slurry including silicon suppressors and abrasive materials with an abrasive size in a range from about 1 nm to about 150 nm. The abrasive materials may include Ce(OH)$_x$, CeO$_2$, SiO$_2$, TiO$_2$, Al$_2$O$_3$, ZrO$_2$, MnO, or the like or a combination thereof.

In some embodiments, the formed dual capping structure has a top surface that is substantially level with the top surface 103 of the fin structure 101 (i.e., the fins 101a, 101b, 101c, 101d, and 101e). In those cases, the dual capping structure covering the insulating layer 120 includes a portion of the first capping layer 130 remaining in the opening 110a (not shown and indicated in FIG. 5) and a portion of the second capping layer 140 remaining in the opening 130a (not shown and indicated in FIG. 6). As a result, the first capping layer 130 is between the insulating layer 120 and the second capping layer 140, and the second capping layer 140 has a top surface that is substantially level with the top surface 103 of the fins 101a, 101b, 101c, 101d, and 101e.

Although the first capping layer 130 made of a nitrogen-containing material can serve as an etching stop layer for the post etching process, the nitrogen atoms in the first capping layer 130 may react with the slurry to form ammonia or byproducts that is harmful of the silicon suppressors in the slurry and increases the pH value of the slurry. As a result, the remove rate of the fins 101a, 101b, 101c, 101d, and 101e is increased due to the change of the property of the slurry, thereby undesirably reducing the fin height.

However, as shown in FIG. 7, when the fins 101a, 101b, 101c, 101d, and 101e is exposed due to the polishing process, the contact area between the first capping layer 130 and the slurry is greatly reduced because the second capping layer 140 (which is made of a nitrogen-free material) covers the most of the top surface of the first capping layer 130. Accordingly, the second capping layer 140 greatly mitigates the reaction between the first capping layer 130 and the slurry, so as to prevent the property of the slurry from being changed.

Moreover, the polishing selectivity of the second capping layer 140 (which is made of a nitrogen-free material) to the fins 101a, 101b, 101c, 101d, and 101e is greater than that of the first capping layer 130 (which is made of a nitrogen-containing material) to the fins 101a, 101b, 101c, 101d, and 101e. Accordingly, the endpoint detection for the polishing process can be controlled by using the second capping layer 140 as a polishing stop layer, so that the polishing process can stop on the top surfaces 103 of the fins 101a, 101b, 101c, 101d, and 101e. For example, the polishing selectivity of the second capping layer 140 to the fins 101a, 101b, 101c, 101d, and 101e is more than 250 and the polishing selectivity of the first capping layer 130 to the fins 101a, 101b, 101c, 101d, and 101e is more than 100.

As a result, since such a dual capping structure can ensure that the polishing process (e.g., the CMP process) is capable of stopping on the top surfaces 103 of the fins 101a, 101b, 101c, 101d, and 101e, the fin loss problem can be mitigated or eliminated.

Figure 8:
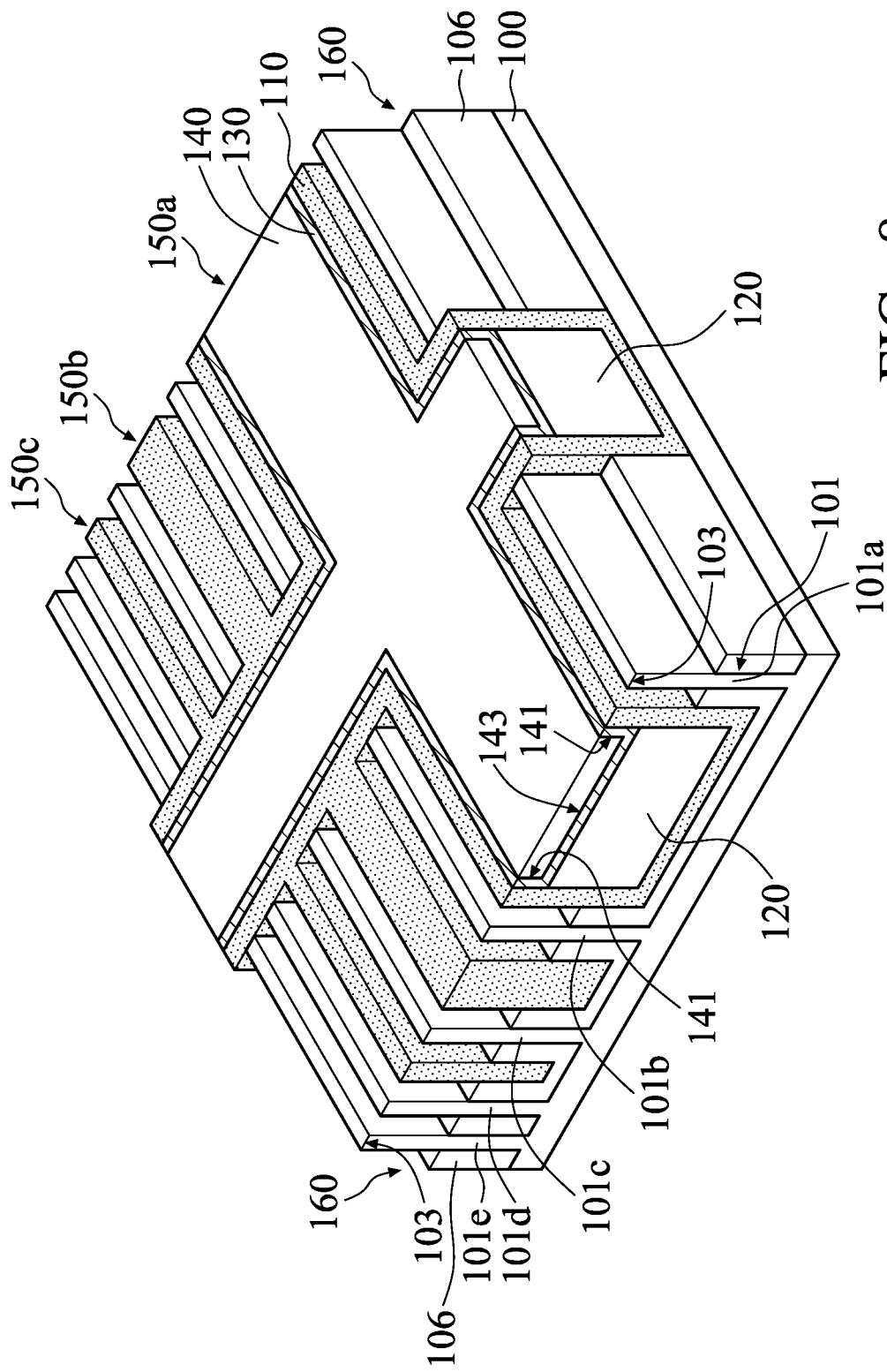

Afterwards, the remaining insulating liner 106 is further recessed, as shown in FIG. 8 in accordance with some embodiments. In some embodiments, a portion of the insulating liner 106 is removed by an etching process, so as to form an isolation feature 160 between and adjacent to the fins 101a, 101b, 101c, 101d, and 101e. For example, the etching process may be a dry etching process, a wet etching process, or a combination thereof. The isolation feature 160 including the remaining insulating liner 106 may be shallow trench isolation (STI) structures that surround the fin structure 101. The lower portions of the fins 101a, 101b, 101c, 101d, and 101e are surrounded by the isolation feature 160, and the upper portion of the fins 101a, 101b, 101c, 101d, and 101e protrude from the isolation feature 160. In other words, a portion of the fin structure 101 is embedded in the isolation feature 160. The isolation feature 160 may prevent electrical interference or crosstalk.

In some embodiments, after the remaining insulating liner 106 is recessed, fin isolation structures 150a, 150b, and 150c are also formed. The fin isolation structure 150a is formed between the fins 101a and 101b, the fin isolation structure 150b is formed between the fins 101b and 101c, and the fin isolation structure 150c is formed between the fins 101c and 101d.

More specifically, the fin isolation structure 150a includes the insulating layer 110 partially embedded in and surrounded by the isolation feature 160 between the fins 101a and 101b, the insulating layer 120 surrounded by the insulating layer 110, and the dual capping structure including the first capping layer 130 and the second capping layer 140 over the insulating layer 120 and surrounded by the insulating layer 110. The fin isolation structures 150b includes the insulating layer 110 partially embedded in and surrounded by the isolation feature 160 between the fins 101b and 101c. Similarly, the fin isolation structures 150c includes the insulating layer 110 partially embedded in and surrounded by the isolation feature 160 between the fins 101c and 101d.

After the isolation feature 160 and the fin isolation structures 150a, 150b, and 150c are formed, dummy gate structures (not shown) are formed over the isolation feature 160 and across the fin isolation structures 150a, 150b, and 150c, in accordance with some embodiments. The dummy gate structures extend between the fin structure 101 and the fin isolation structures 150a, 150b, and 150c. Each dummy gate structure may include a dummy gate insulating layer and a dummy gate electrode layer over the dummy gate insulating layer.

Gate spacer layers 171 are formed on opposite sidewall surfaces of the corresponding dummy gate structure, in accordance with some embodiments. The gate spacer layers 171 may be made of silicon nitride, silicon oxide, silicon carbide, silicon oxynitride, or another applicable material.

Afterwards, a portion of the fin structure 101 that is exposed from the gate spacer layers 171 and the dummy gate structures is recessed, in accordance with some embodiments. In some embodiments, the fin structure 101 is recessed by an etching process, so that the top surface of the recessed fin structure 101 is lower than the top surface of the isolation feature 160. Afterwards, source/drain (S/D) features 175 are formed over the recessed fin structure 101 and protrude from the isolation feature 160, in accordance with some embodiments. In some embodiments, a strained material is grown over the recessed fin structure 101 by an epitaxial process to form the S/D features 175. The S/D features 175 are formed on opposing sidewall surfaces of the corresponding dummy gate structure. In some embodiments, the S/D features 175 include Ge, SiGe, InAs, InGaAs, InSb, GaAs, GaSb, InAlP, InP, or the like.

After the S/D features 175 are formed, an inter-layer dielectric (ILD) layer (not shown) is formed over the substrate 100, in accordance with some embodiments. In some embodiments, the ILD layer may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. The ILD layer may be formed by CVD, ALD, physical vapor deposition, (PVD), spin-on coating, or another applicable process. Afterwards, a planarization process, such as a CMP process, is performed on the ILD layer until the top surfaces of the dummy gate structures are exposed.

Figure 9:
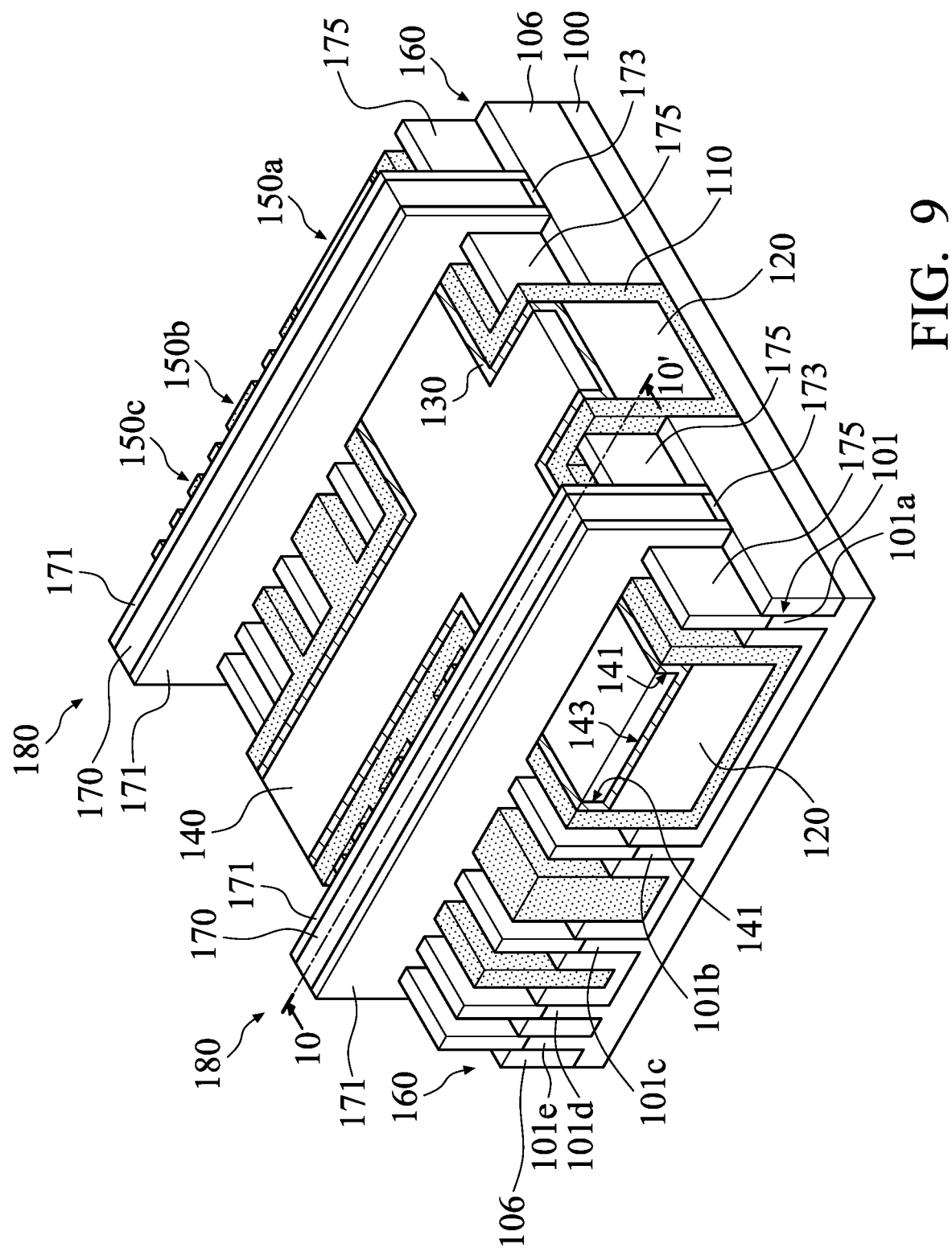
Figure 10:
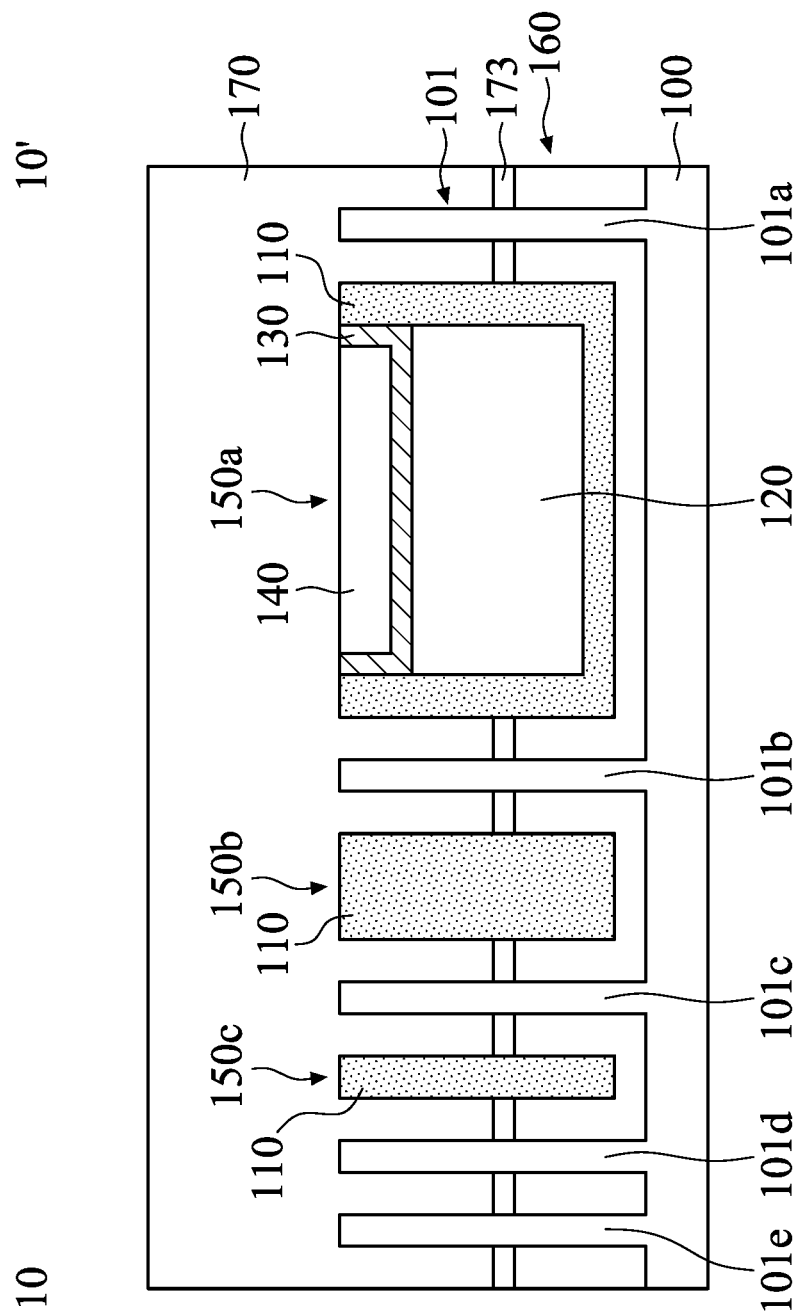
FIG. 10 is a schematic cross-sectional view showing the semiconductor device structure taken along the line 10-10' in FIG. 9.

Afterwards, the dummy gate structures are removed and replaced by active gates structures 180, as shown in FIGS. 9 and 10 in accordance with some embodiments. FIG. 10 is a schematic cross-sectional view showing the semiconductor device structure taken along the line 10-10' in FIG. 9. In some embodiments, the dummy gate structures are removed by an etching process, such as a dry etching process or a wet etching process.

Since the dummy gate structures are removed and replaced by the active gates structures 180, the active gates structures 180 are formed over the isolation feature 160 and across the fin isolation structures 150a, 150b, and 150c, in accordance with some embodiments. The active gates structures 180 extend between the fin structure 101 and the fin isolation structures 150a, 150b, and 150c. Similar to the dummy gate structure, each active gates structure 180 may include a gate insulating layer 173 and a gate electrode layer 170 over the gate insulating layer 173.

In some embodiments, the gate insulating layer 173 is made of a high k dielectric material, such as metal oxide. Examples of the high-k dielectric material may include hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or other applicable dielectric materials. In some embodiments, the gate insulating layer 173 may be formed by CVD, PVD, ALD, or another applicable process.

In some embodiments, the gate electrode layer 170 is made of tungsten (W). In some embodiments, the gate electrode layer 170 is formed by CVD, PECVD, HDPCVD, MOCVD, or another applicable process.

Figure 11:
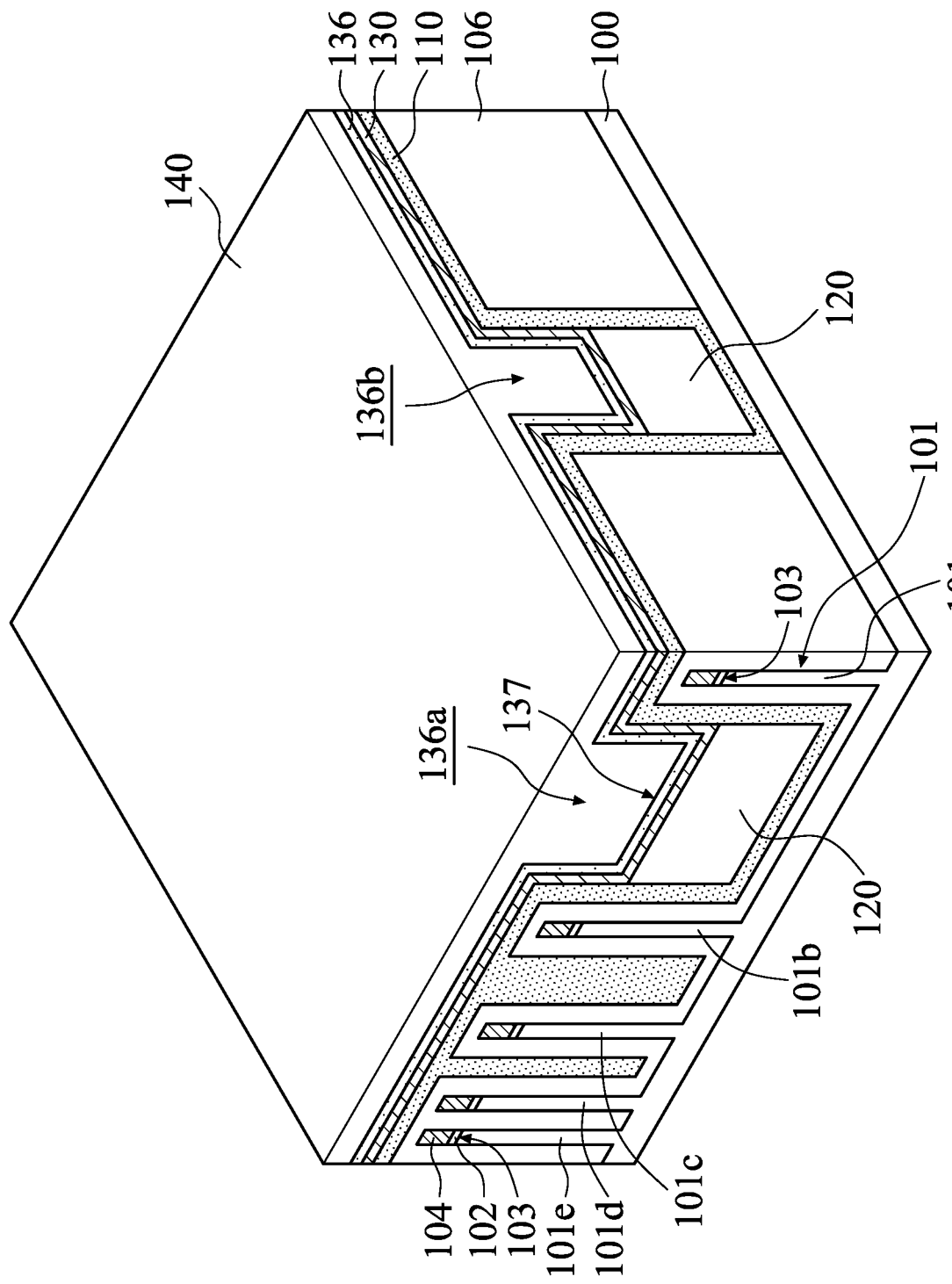
FIGS. 11, 12, and 13 show perspective representations of various stages of forming a semiconductor device structure, in accordance with some embodiments of the disclosure.
Figure 12:
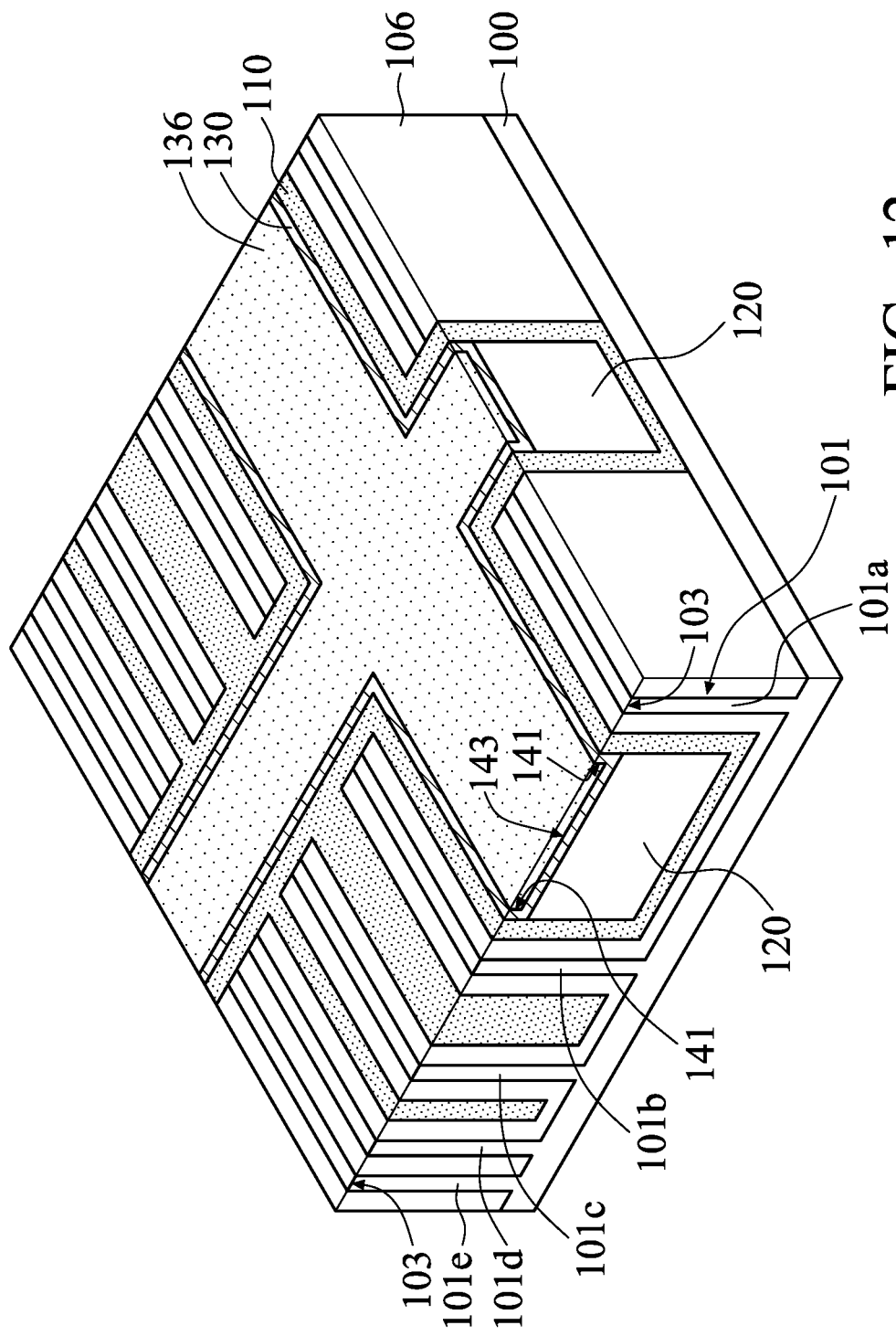
Figure 13:
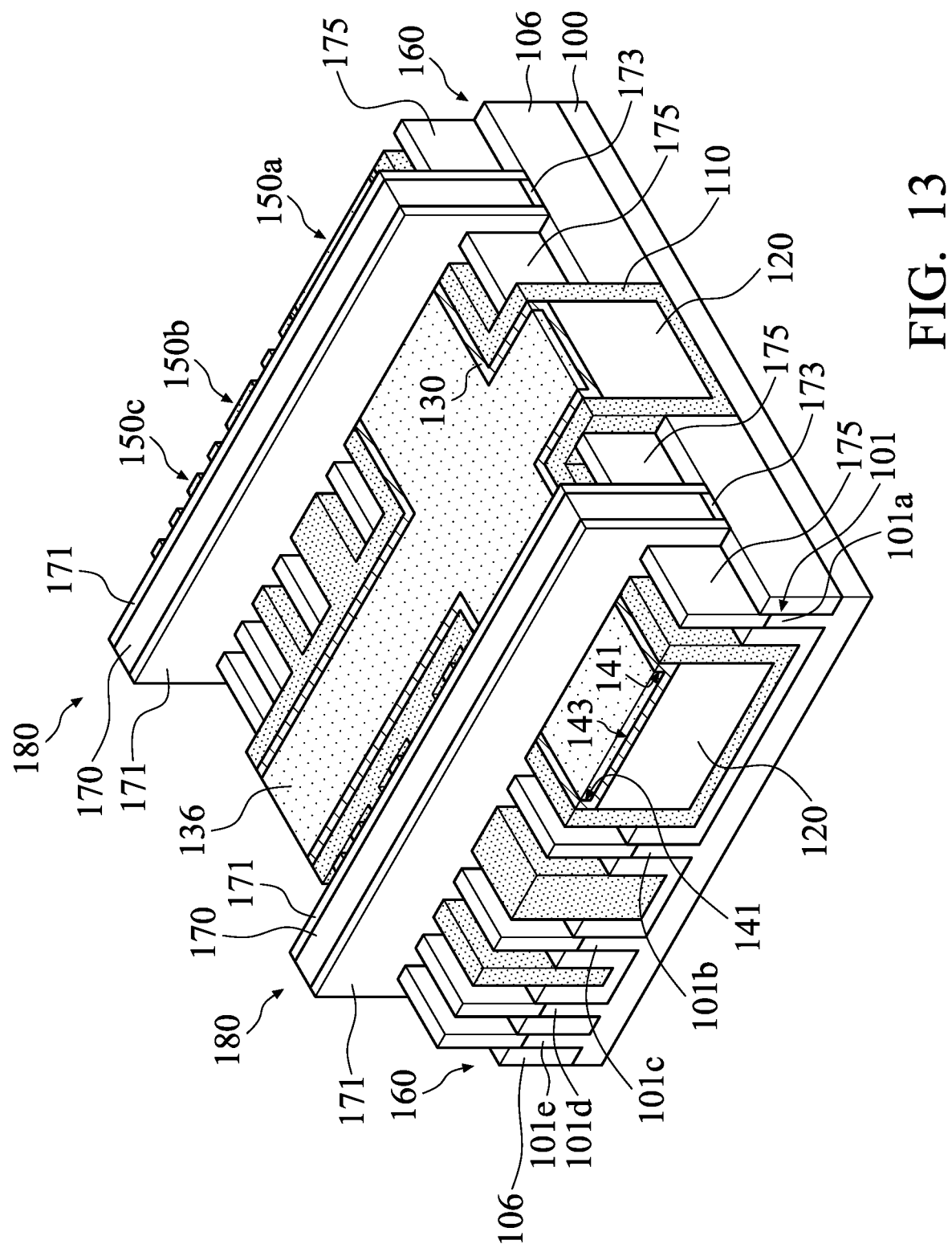

Many variations and/or modifications can be made to embodiments of the disclosure. FIGS. 11, 12, and 13 show perspective representations of various stages of forming a semiconductor device structure, in accordance with some embodiments of the disclosure. The stages shown in FIGS. 11, 12, and 13 are similar to those shown in FIGS. 1, 2, 3, 4, 5, 6, 7, 8, and 9. In some embodiments, the materials, formation methods, and/or benefits of the semiconductor device structure shown in FIGS. 1, 2, 3, 4, 5, 6, 7, 8, and 9 can also be applied in the embodiments illustrated in FIGS. 11, 12, and 13, and are therefore not repeated.

A structure similar to FIG. 6 is provided, as shown in FIG. 11 in accordance with some embodiments. Unlike the structure shown in FIG. 6, the structure shown in FIG. 11 further includes an intermediate capping layer 136 formed between the first capping layer 130 and the second capping layer 140 in accordance with some embodiments. In some embodiments, the intermediate capping layer 136 is formed over the first capping layer 130 above the fins 101a, 101b, 101c, 101d, and 101e and the insulating layer 120 in the openings 110a and 110b and conformally lines the upper portion of the openings 130a and 130b (not shown and as indicated in FIG. 6), so as to form openings 136a and 136b corresponding to the openings 130a and 130b. In some embodiments, the intermediate capping layer 136 in those openings 136a and 136b has sidewall surfaces covered by the first capping layer 130. Moreover, the second insulating layer 120 provides a sufficient recess depth, so that the bottom of the opening 136a is substantially level with or above the top surfaces 103 of the fins 101a, 101b, 101c, 101d, and 101e.

In some embodiments, the second capping layer 140 is formed over the insulating layer 110 above the patterned second masking layer 104 and fills the openings 136a and 136b. As a result, the second capping layer 140 in the opening 136a has sidewall surfaces and a bottom surface (i.e., the bottom 137 of the opening 136a) that are covered by the intermediate capping layer 136, so that the insulating layer 110 between the fins 101a and 101b is separated from the second capping layer 140 by the first capping layer 130 and the intermediate capping layer 136.

In some embodiments, the first capping layer 130 is made of a nitrogen-containing material or carbon- and nitrogen-containing material. For example, the first capping layer 130 is made of SiN, SiON, SiCN, SiOCN, TiN, AlON or another applicable material. The first capping layer 130 may be deposited by an ALD process, a CVD process, or another applicable process. In some embodiments, the intermediate capping layer 136 is made of a material that is different from the material of the first capping layer 130. For example, the intermediate capping layer 136 is made of a nitrogen-free material that is different from that of the second capping layer 140. For example, the intermediate capping layer 136 is made of Si, SiC, SiOC, SiO, $SiO_2$, $HfO_x$, $ZrO_2$, $Al_2O_3$, or another applicable material. The intermediate capping layer 136 may be deposited by a CVD process, a PECVD process, or another applicable process.

After the second capping layer 140 is formed, a polishing process that is the same as or similar to the polishing process shown in FIG. 7 is performed, as shown in FIG. 12 in accordance with some embodiments. As a result, the fins 101a, 101b, 101c, 101d, and 101e are exposed and a dual capping structure covering the entire top surface 120a (not shown and as indicated in FIG. 5) of the insulating layer 120 is formed. Unlike the dual capping structure shown in FIG. 7, the dual capping structure includes the first capping layer 130 and the intermediate capping layer 136 since the second capping layer 140 is entirely removed during the polishing process.

After the dual capping structure is formed, the remaining insulating liner 106 is further recessed by a method that is the same as or similar to the method shown in FIG. 8 in accordance with some embodiments, so as to form an isolation feature 160 and fin isolation structures 150a, 150b, and 150c.

Afterwards, gate spacer layers 171 and active gates structures 180 are formed over the isolation feature 160 and across the fin isolation structures 150a, 150b, and 150c by a method that is the same as or similar to the method shown in FIG. 9, as shown in FIG. 13 in accordance with some embodiments. The active gates structures 180 extend between the fin structure 101 and the fin isolation structures 150a, 150b, and 150c. Each active gates structure 180 may include a gate insulating layer 173 and a gate electrode layer 170 over the gate insulating layer 173.

Embodiments of a semiconductor device structure and a method for forming the same are provided. The semiconductor device structure includes a fin isolation structure formed between adjacent first and second fins that protrude from a substrate and between adjacent first and gate structures that across the first and second fins, respectively. The fin isolation structure includes a first insulating layer, a second insulating layer in the first insulating layer, and a capping structure in the first insulating layer and covers the second insulating layer. The capping structure prevents the property of the polishing slurry from being changed, thereby ensuring that the polishing process can stop on the top surfaces of the first and second fins. As a result, the polishing endpoint detection can be controlled, and the fin loss problem can be mitigated or eliminated.

In some embodiments, a semiconductor device structure is provided. The semiconductor device structure includes a substrate having adjacent first and second fins protruding from the substrate. The semiconductor device structure also includes a first gate structure and a second gate structure across the first and second fins, respectively. The semiconductor device structure further includes an insulating structure between the first gate structure and the second gate structure. The insulating structure includes a first insulating layer separating the first fin from the second fin, a capping structure formed in the first insulating layer, and a second insulating layer covered by the first insulating layer and the capping structure.

In some embodiments, a semiconductor device structure is provided. The semiconductor device structure includes a substrate having a first fin, a second fin, and a third fin protruding from the substrate. The second fin is adjacent to and spaced apart from the first fin along a first direction. The third is fin adjacent to and spaced apart from the first fin along a second direction that is different from the first direction. The semiconductor device structure also includes a first insulating layer having a first portion formed between the first fin and the second fin, and a second portion formed between the first fin and the third fin. The semiconductor device structure further includes a second insulating layer having a first portion formed in the first portion of the first insulating layer, and a second portion formed in the second portion of the first insulating layer. In addition, the semiconductor device structure includes a capping structure formed in the first insulating layer to cover the first and second portions of the second insulating layer.

In some embodiments, a method for forming a semiconductor device structure is provided. The method includes patterning a substrate to define first and second fins separating from each other by a first opening and cutting the first and second fins to form a second opening that divides each of the first and second fins into two parts. The method also includes conformally forming a first insulating layer in the first and second openings. The method further includes forming a second insulating layer in the first and second openings opening to cover the first insulating layer and recessing the second insulating layer, so that a portion of the first insulating layer protrudes above a top of the second insulating layer. In addition, the method includes forming a dual capping structure in the first and second openings to cover the top of the second insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having adjacent first and second fins protruding from the substrate;
   a first gate structure and a second gate structure across the first and second fins, respectively;
   an insulating structure between the first gate structure and the second gate structure, comprising:
      a first insulating layer separating the first fin from the second fin;
      a capping structure formed in the first insulating layer; and
      a second insulating layer covered by the first insulating layer and the capping structure; and
   a first insulating liner formed between the substrate and the first gate structure, and a second insulating liner formed between the substrate and the second gate structure, wherein the first insulating liner and the second are separated from each other by and in direct contact with the insulating structure.

2. The semiconductor device structure as claimed in claim 1, wherein the capping structure comprises:
   a first capping layer covering a sidewall of the first insulating layer and a top surface of the second insulating layer; and
   a second capping layer formed in the first capping layer.

3. The semiconductor device structure as claimed in claim 2, wherein a top surface of the second capping layer is substantially level with top surfaces of the first insulating layer and the first capping layer.

4. The semiconductor device structure as claimed in claim 2, wherein the first capping layer is made of a nitrogen-containing material and the second capping layer is made of a nitrogen-free material.

5. The semiconductor device structure as claimed in claim 2, further comprising an isolation feature formed below the first gate structure and the second gate structure, wherein the first insulating layer extends into the isolation feature.

6. The semiconductor device structure as claimed in claim 5, wherein the top surface of the second insulating layer is above a top surface of the isolation feature.

7. The semiconductor device structure as claimed in claim 1, wherein the first insulating layer, the second insulating layer, and the capping structure extend directly below the first gate structure and the second gate structure.

8. A semiconductor device structure, comprising:
   a substrate having a first fin, a second fin, and a third fin protruding from the substrate, wherein the second fin is adjacent to and spaced apart from the first fin along a first direction and the third fin adjacent to and spaced apart from the first fin along a second direction that is different from the first direction;
a first insulating layer having a first portion formed between the first fin and the second fin and a second portion formed between the first fin and the third fin;
a second insulating layer having a first portion formed in the first portion of the first insulating layer and a second portion formed in the second portion of the first insulating layer; and
a capping structure formed in the first insulating layer to cover the first and second portions of the second insulating layer.

9. The semiconductor device structure as claimed in claim 8, wherein the capping structure has a top surface that is substantially level with top surfaces of the first and second portions of the first insulating layer.

10. The semiconductor device structure as claimed in claim 8, wherein the capping structure comprises:
a nitrogen-free material layer formed over the second insulating layer; and
a nitrogen-containing material layer between the second insulating layer and the nitrogen-free material layer and between the first insulating layer and the nitrogen-free material layer.

11. The semiconductor device structure as claimed in claim 10, wherein the nitrogen-containing material layer between the first insulating layer and the nitrogen-free material layer has a top surface that is substantially level with a top surface of the nitrogen-free material layer.

12. The semiconductor device structure as claimed in claim 10, wherein the nitrogen-free material layer is made of Si, SiC, SiOC, SiO, $SiO_2$, HfOx, $ZrO_2$, or $Al_2O_3$.

13. The semiconductor device structure as claimed in claim 10, wherein the nitrogen-containing material layer is made of SiN, SiON, SiCN, SiOCN, TiN, or AlON.

14. The semiconductor device structure as claimed in claim 8, further comprising a gate structure separating the first portion of the first insulating layer from the first fin and the second fin, wherein the gate structure is across a first portion of the capping structure that covers the first portion of the second insulating layer.

15. The semiconductor device structure as claimed in claim 14, wherein a second portion of the capping structure that covers the second portion of the second insulating layer is exposed from the gate structure.

16. The semiconductor device structure as claimed in claim 8, further comprising an isolation feature formed over the substrate and between the first fin and the second fin, wherein the isolation structure separates the first portion of the first insulating layer from the substrate and the first and second fins.

17. A method of forming a semiconductor device structure, comprising:
patterning a substrate to define first and second fins separating from each other by a first opening;
cutting the first and second fins to form a second opening that divides each of the first and second fins into two parts;
conformally forming a first insulating layer in the first and second openings;
forming a second insulating layer in the first and second openings opening to cover the first insulating layer;
recessing the second insulating layer, so that a portion of the first insulating layer protrudes above a top of the second insulating layer; and
forming a dual capping structure in the first and second openings to cover the top of the second insulating layer.

18. The method as claimed in claim 17, wherein the formation of the dual capping structure comprises:
conformally forming a first capping layer in the first and second openings to cover the top of the second insulating layer and the portion of the first insulating layer protruding above the top of the second insulating layer;
forming a second capping layer over the first capping layer and filling the first and second openings; and
successively polishing the second capping layer and the first capping layer until the first and second fins are exposed.

19. The method as claimed in claim 17, wherein the formation of the dual capping structure comprises:
successively and conformally forming the first capping layer and the second capping layer in the first and second openings to cover the top of the second insulating layer and the portion of the first insulating layer protruding above the top of the second insulating layer;
forming a third capping layer over the second capping layer and filling the first and second openings; and
successively polishing the third capping layer, the second capping layer, and the first capping layer until the first and second fins are exposed, wherein the third capping layer is entirely removed after the first and second fins are exposed.

20. The method as claimed in claim 17, wherein the dual capping structure comprises a nitrogen-containing material layer and a nitrogen-free material layer over the nitrogen-containing material layer.

* * * * *